US008520885B2

(12) United States Patent
Tanabe

(10) Patent No.: US 8,520,885 B2
(45) Date of Patent: Aug. 27, 2013

(54) COMPOSITE SPEAKER

(75) Inventor: Kei Tanabe, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 195 days.

(21) Appl. No.: 13/273,627

(22) Filed: Oct. 14, 2011

(65) Prior Publication Data

US 2012/0148086 A1 Jun. 14, 2012

(30) Foreign Application Priority Data

Dec. 8, 2010 (JP) ................................ 2010-273961

(51) Int. Cl.
*H05K 5/00* (2006.01)
*H04R 1/02* (2006.01)

(52) U.S. Cl.
USPC .......................................... 381/396; 181/144

(58) Field of Classification Search
USPC ................................. 381/396, 401; 181/144
See application file for complete search history.

(56) References Cited

U.S. PATENT DOCUMENTS

2006/0120551 A1* 6/2006 Enomoto et al. .............. 381/396
2006/0153417 A1* 7/2006 Furuya .......................... 381/396

FOREIGN PATENT DOCUMENTS

JP A1 06-189394 7/1994

* cited by examiner

*Primary Examiner* — Brian Ensey
(74) *Attorney, Agent, or Firm* — Brinks Hofer Gilson & Lione

(57) ABSTRACT

A composite speaker is disclosed that can more easily be made thin and small, and is configured so that the assembly process of the speaker is easy. A first space that opens to the rear is formed in a main yoke that forms a magnetic field emitter, and a magnetic gap is formed in the first space. A first voice coil, connected to an inner peripheral end of a first diaphragm whose surface area is large, is inserted into the first magnetic gap toward the front direction. A second space that passes through from front to back is provided in the main yoke, a second magnetic field emitter is mounted therein, and a second diaphragm whose surface area is small is provided in front thereof. Because of the structure in which the second magnetic field emitter is housed within the first magnetic field emitter, the front-to-back dimension of the speaker can be reduced.

20 Claims, 4 Drawing Sheets

COMPOSITE SPEAKER

RELATED APPLICATIONS

The present application claims priority to Japanese Patent Application Number 2010-273961, filed Dec. 8, 2010, the entirety of which is hereby incorporated by reference.

FIELD OF THE INVENTION

The present invention relates to composite speakers provided with two diaphragms having different surface areas and capable of producing sound over a wide frequency band, and particularly relates to composite speakers having a structure that enables the speakers to be made thin while also being easy to assemble.

DESCRIPTION OF RELATED ART

A composite speaker that includes two diaphragms is disclosed in JP-1994(H06)-189394A. A first diaphragm, which is conical in shape and has a large surface area, and a second diaphragm, which is dome-shaped and has a small surface area, are provided in this composite speaker.

A first yoke, which forms a magnetic field emitter, has a recess that opens widely in the forward direction, and a ring-shaped second yoke is anchored to the interior of the recess. A ring-shaped first magnet is anchored to the inner circumferential surface of the recess in the first yoke, and a first magnetic gap is formed between the inner circumferential surface of the first magnet and the outer circumferential surface of the second yoke. A first voice coil that drives the first diaphragm is inserted, from front to back, into the first magnetic gap.

A second magnet and a plate are layered, in that order toward the front, and anchored to the central area surrounded by the second yoke; a second magnetic gap is formed between the inner circumferential surface of the second yoke and the outer circumferential surface of the plate. A second voice coil that drives the second diaphragm is inserted, from front to back, into the second magnetic gap.

This composite speaker produces sound pressure in comparatively low bands using the conical first diaphragm, and produces sound pressure in comparatively high bands using the dome-shaped second diaphragm.

The composite speaker disclosed in JP-1994(H06)-189394A has the following problems listed as examples hereinafter.

(1) The first voice coil that drives the first diaphragm and the second voice coil that drives the second diaphragm are both inserted, from the front to the back, into the magnetic gaps formed within the recess of the first yoke; a bobbin upon which the first voice coil is wound and a bobbin upon which the second voice coil is wound protrude from the front of the second yoke. For this reason, both the first diaphragm and the second diaphragm are disposed in a region that is in front of the first yoke, which makes it difficult to reduce the dimensions of the front-to-back thickness of the composite speaker.

(2) A support member that supports the second diaphragm, a damper member, and so on are assembled within the narrow space surrounded by the bobbin that is attached to the first diaphragm, which makes the assembly procedures complex.

(3) The bobbin that is linked to the conical first diaphragm protrudes forward in the region surrounding the dome-shaped second diaphragm, and thus the region around the second diaphragm cannot be used in an efficient manner; for example, it is difficult to dispose a horn for directing sound pressure in the higher ranges in the forward direction. Even if the horn can be disposed, it is limited to a small horn, which makes it difficult to fully realize the function of the horn, which is to transmit sound pressure in the forward direction.

The present invention solves the aforementioned problems with the related art, and it is an object thereof to provide a composite speaker that is thin and achieves a small size, and that also has a structure that makes the composite speaker easy to assemble.

SUMMARY OF THE INVENTION

A composite speaker according to one embodiment of the present invention includes a first diaphragm, a second diaphragm having a smaller surface area than the first diaphragm, a first voice coil that drives the first diaphragm, and a second voice coil that drives the second diaphragm; in which a first space that is open at least toward the rear is formed in a main yoke formed of a magnetic material, a ring-shaped first magnet is anchored to the interior of the first space, a first magnetic gap is formed between the inner circumferential surface or the outer circumferential surface of the first magnet and the main yoke, and the first voice coil is positioned within the first magnetic gap; and a second space that is open at least toward the front is formed in a region surrounded by the first magnet of the main yoke, and the second voice coil and a second magnetic field emitter that drives the second voice coil are housed within the second space.

Furthermore, one embodiment may be configured such that the first diaphragm is radially positioned further outward than the first voice coil, and the second diaphragm is radially positioned further inward than the second voice coil.

In the composite speaker according to one embodiment, the voice coil that drives the first diaphragm, whose surface area is large, is positioned within the first space that opens to the rear of the main yoke. Therefore, the first diaphragm, which may be conical, and the bobbin connected to the first diaphragm, do not project significantly forward beyond the second diaphragm, making it easy to configure the overall speaker with a small front-to-back dimension. Because the inner peripheral end of the first diaphragm, the bobbin, and so on are not present in the region on the outer side of the second diaphragm, the region surrounding the second diaphragm can be used efficiently, making it easy to dispose a support member for supporting the second diaphragm, a damper member, or the like.

In one aspect, it is preferable for the second space to be formed so as to pass through the main yoke from front to back. In this case, the second magnetic field emitter is positioned within a region surrounded by the ring-shaped first magnet. By forming the second space so as to pass through the main yoke from front to back, and by providing the second voice coil and the second magnetic field emitter within the second space, the front-to-back dimension of the speaker can be made even thinner.

Furthermore, one embodiment of the present invention can be configured such that the second magnetic field emitter includes an inner yoke having a forward recess that is open toward the front, a second magnet anchored to the inner base of the forward recess, and an opposing yoke anchored to the front of the second magnet, a second magnetic gap in which the second voice coil is positioned is formed between the inner circumferential surface of the forward recess and the opposing yoke, and the inner yoke is mounted in the second space from the front. According to this configuration, the second magnetic field emitter can be inserted into the second space of the main yoke after the second magnetic field emitter has been assembled, which makes the assembly process easy.

In one aspect, it is preferable for at least part of the main yoke to be positioned further toward the rear than an outer peripheral end of the first diaphragm and further toward the front than an inner peripheral end of the first diaphragm. Furthermore, it is preferable for the inner peripheral end of the first diaphragm to be positioned more toward the rear than the front end of the main yoke. By employing this configuration, at least part of the main yoke can be disposed within the space surrounded by the conical first diaphragm, which makes it easy to reduce the front-to-back dimension.

An embodiment of the present invention can also be configured such that multiple slits that are open toward the rear are provided in the main yoke so as to communicate with the first space, and linking members that connect the first diaphragm to the first voice coil are positioned within the slits.

Furthermore, an embodiment of the present invention can also be configured such that a horn portion that directs sound pressure produced by the second diaphragm vibrating toward the front is provided in front of the first voice coil.

The composite speaker according to the present invention is configured so as to include the first diaphragm and the second diaphragm; however, the front-to-back dimension of the composite speaker can be reduced, and the assembly process can be made easy.

DETAILED DESCRIPTION OF THE INVENTION

Figure 1:
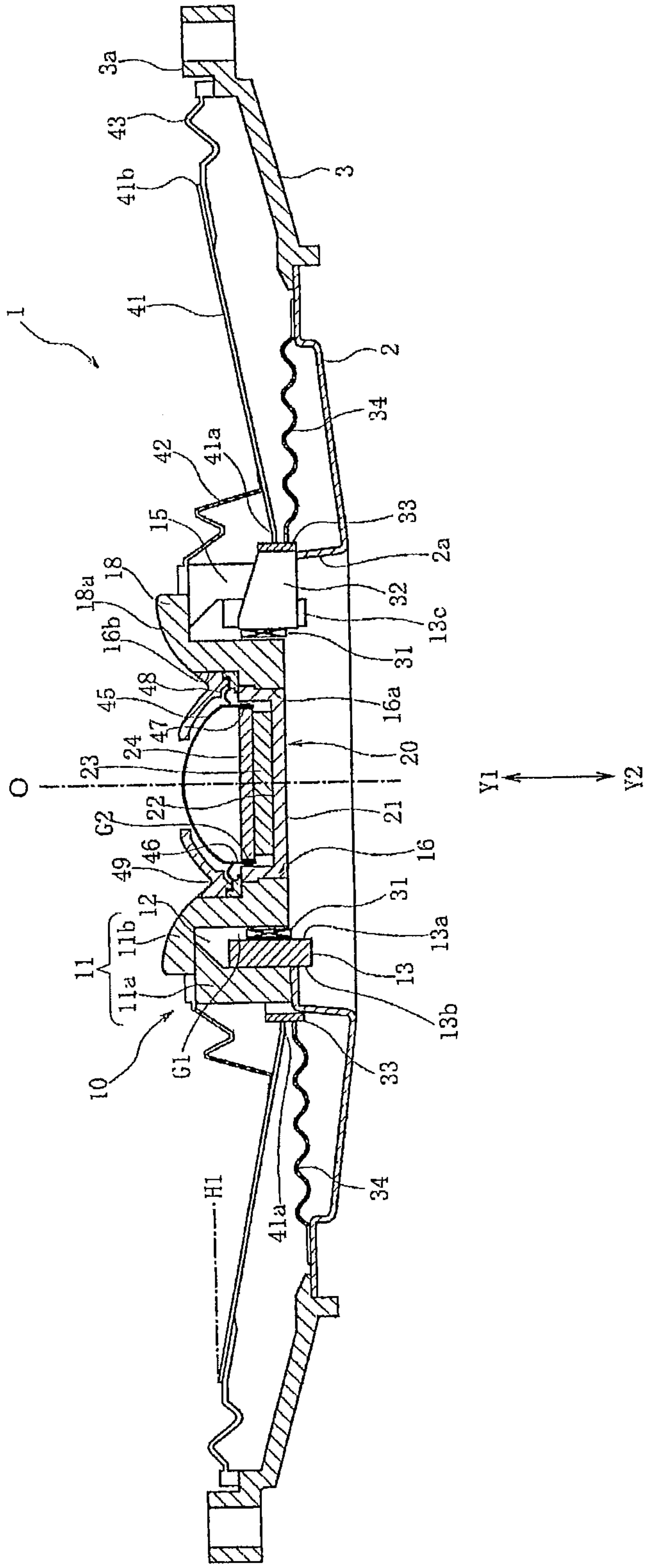
FIG. 1 is a vertical cross-sectional view of a composite speaker according to a first embodiment of the present invention.

A composite speaker 1 according to the first embodiment illustrated in FIG. 1 takes the Y1 direction as the forward direction or the sound emission direction, and the Y2 direction as the rear direction. In FIG. 1, a center line O extending forward and backward from the composite speaker 1 is shown.

The composite speaker 1 includes an inner frame 2 and an outer frame 3 that is anchored to the outer periphery of the inner frame 2. The inner frame 2 and the outer frame 3 may be formed of a non-magnetic material, such as a synthetic resin, a non-magnetic metal, or the like.

An opening 2*a* that opens to the front and the rear is formed in the central area of the inner frame 2, and a first magnetic field emitter 10 is anchored to the front end of this opening 2*a*. A second magnetic field emitter 20 is held in the central area of the first magnetic field emitter 10.

Figure 2:
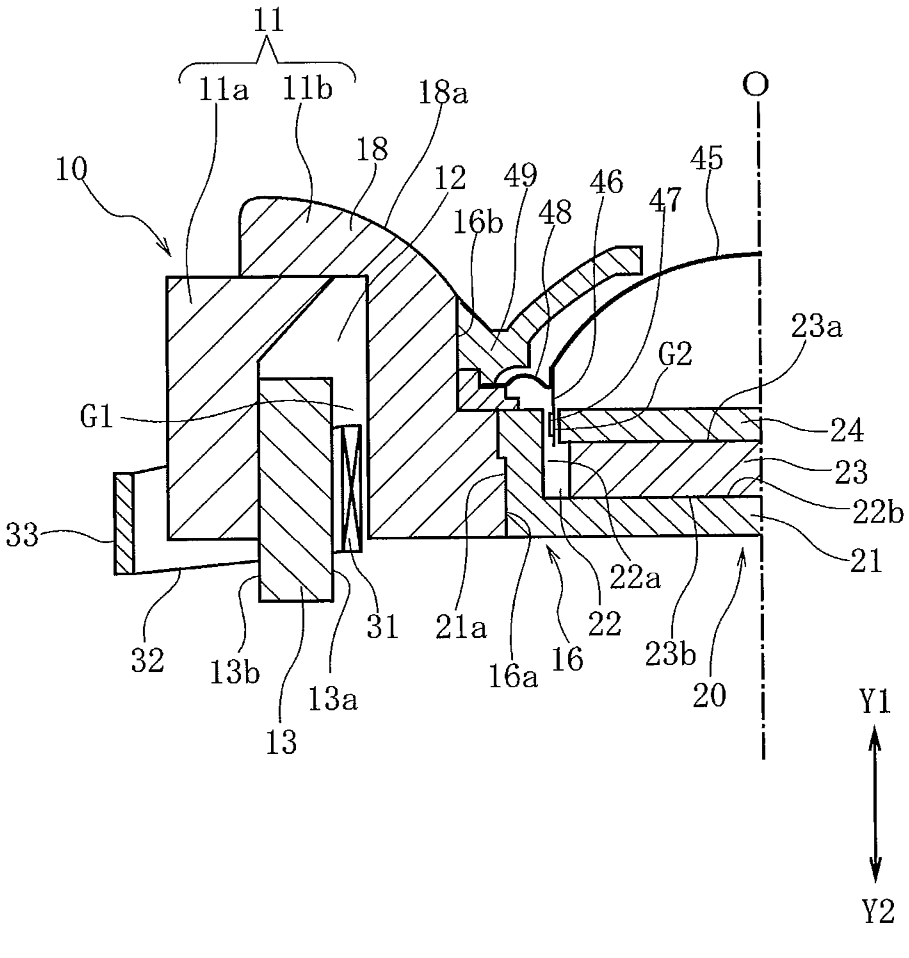
FIG. 2 is a partial cross-sectional view showing a close-up of a magnetic field emitter of the composite speaker illustrated in FIG. 1.

As shown in FIG. 1 and FIG. 2, the magnetic field emitter 10 includes a main yoke 11. The main yoke 11 is configured by an outer peripheral yoke 11*a* and an inner peripheral yoke 11*b*. The outer peripheral yoke 11*a* and the inner peripheral yoke 11*b* are ring-shaped with their centers located on the center line O, are formed of a magnetic metal, and are bonded and anchored to each other. As shown in FIG. 1, the outer peripheral yoke 11*a* is anchored to the front end of the opening 2*a* in the outer frame 3, and the first magnetic field emitter 10 is anchored to the inner frame 2.

At the joint of the main yoke 11, a first space 12 is formed between the inner circumferential surface of the outer peripheral yoke 11*a* and the outer circumferential surface of the inner peripheral yoke 11*b*. The inner circumferential surface of the outer peripheral yoke 11*a* and the outer circumferential surface of the inner peripheral yoke 11*b* are cylindrical surfaces centered on the center line O, and the first space 12 is a ring-shaped space that is centered on the center line O. The front of the first space 12 (that is, the Y1 side) may be closed, whereas the rear of the first space 12 (that is, the Y2 side) is open.

A first magnet 13 is anchored within the first space 12. The first magnet 13 is shaped as a ring that is centered on the center line O. The first magnet 13 is magnetized in the radial direction so that an inner circumferential surface 13*a* and an outer circumferential surface 13*b* have opposite poles to each other.

The outer circumferential surface 13*b* of the first magnet 13 is anchored to the inner circumferential surface of the outer peripheral yoke 11*a*, and a first magnetic gap G1 is formed between the inner circumferential surface 13*a* of the first magnet 13 and the outer circumferential surface of the inner peripheral yoke 11*b*. The magnetic flux emitted from the first magnet 13 crosses the magnetic gap G1. Note that, alternatively, the inner circumferential surface 13*a* of the first magnet 13 may be anchored to the outer circumferential surface of the inner peripheral yoke 11*b*, and the first magnetic gap G1 may be formed between the outer circumferential surface 13*b* of the first magnet 13 and the inner circumferential surface of the outer peripheral yoke 11*a*.

Figure 3:
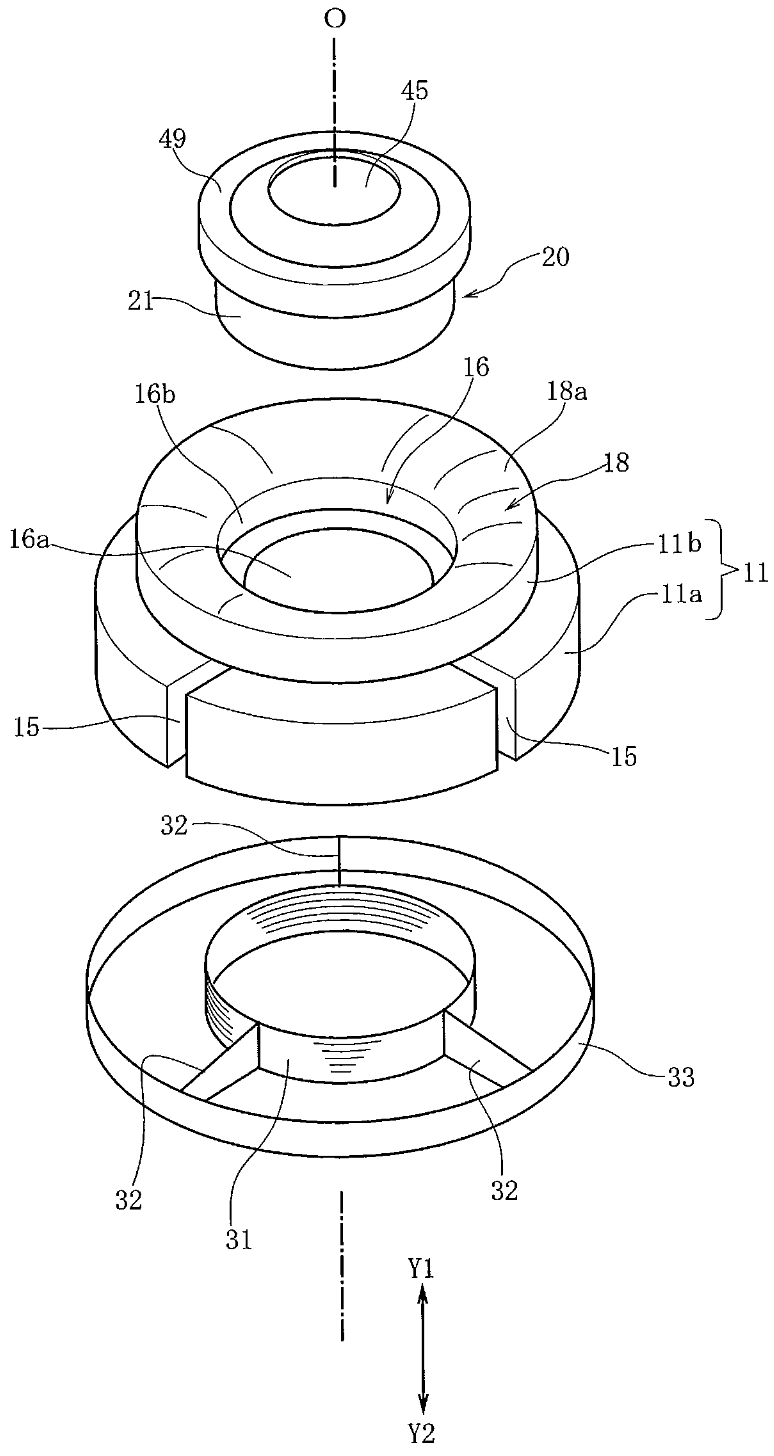
FIG. 3 is an exploded perspective view illustrating the structure of a central area of the composite speaker.

As shown in FIG. 1 and FIG. 3, multiple slits 15 that open rearward (in the Y2 direction) are formed in the outer peripheral yoke 11*a* of the main yoke 11, connecting the outer circumferential surface to the inner circumferential surface thereof. The first space 12 and the space on the outer periphery of the main yoke 11 communicate through these slits 15. As shown in FIG. 3, the slits 15 are formed in three locations, every 120 degrees.

With the first magnetic field emitter 10 shown in FIG. 1 and FIG. 2, the first magnet 13 is anchored to the inner circumferential surface of the outer peripheral yoke 11*a*. Accordingly, slits 13*c* are also provided in the first magnet 13. In other words, the first magnet 13 is divided into three parts, and the slits 13*c* are formed between the end surfaces of the parts into which the first magnet 13 has been divided, on the inner side of the slits 15 formed in the main yoke 11.

As shown in FIG. 1 and FIG. 2, a first voice coil 31 is located within the first magnetic gap G1. As shown in FIG. 3, the first voice coil 31 is configured by wrapping a conducting wire into a cylindrical shape. Radial linking members 32 that extend radially toward the outer peripheral direction are connected to the first voice coil 31 at three locations, and a cylindrical linking member 33 is connected to the outer ends of the radial linking members 32. The radial linking members 32 and the cylindrical linking member 33 may be formed of synthetic resin sheets, paper sheets, cloth sheets, or sheets that are composites thereof.

The first voice coil 31 is located within the first magnetic gap G1, the radial linking members 32 are located within the slits 15 formed in the main yoke 11 and the slits 13*c* of the first magnet 13, and the cylindrical linking member 33 is located at the outer periphery of the outer peripheral yoke 11*a*.

As shown in FIG. 1, a damper member 34 spans between the cylindrical linking member 33 and the inner frame 2. The damper member 34, may be formed of a synthetic resin sheet, a cloth sheet, a paper sheet, or a material that is a composite thereof, and may be formed so that the depressions and protrusions thereof form concentric circles centered on the center line O. The cylindrical linking member 33 and the first voice coil 31 supported thereby are supported by the damper member 34, and are capable of vibrating in the forward and rearward directions.

As shown in FIG. 1, a first diaphragm 41 that produces sound pressure in medium and low bands is provided in the outer periphery of the main yoke 11. The first diaphragm 41 may be conically formed using a synthetic resin sheet, a cloth sheet, a paper sheet, or a material that is a composite thereof. A circular hole is formed in the center of the first diaphragm 41, and the edge of the circular hole corresponds to an inner peripheral end 41*a*. The inner peripheral end 41*a* is positioned so as to surround the outer periphery of the main yoke 11. The inner peripheral end 41*a* of the first diaphragm 41 is connected to the outer side of the cylindrical linking member 33. An inner damper member 42 may be provided between the main yoke 11 and an area of the first diaphragm 41 that is slightly further outside from the inner peripheral end 41*a*. The inner damper member 42 is formed of a synthetic resin sheet, a cloth sheet, a paper sheet, or a material that is a composite thereof, and circular depressions and protrusions are formed therein centered on the center line O.

An outer peripheral end 41*b* of the first diaphragm 41 is located further toward the front than the inner peripheral end 41*a*, and thus the first diaphragm 41 has a conical shape. An outer damper member 43 is attached between the outer peripheral end 41*b* and an outer circumferential edge 3*a* of the outer frame 3. The outer damper member 43 may be formed of a synthetic resin sheet, a cloth sheet, a paper sheet, or a material that is a composite thereof, and circular depressions and protrusions are formed therein centered on the center line O.

As shown in FIG. 1 and FIG. 2, a second space 16 that passes through to the front and the rear is formed in the center of the inner peripheral yoke 11*b*, which forms part of the main yoke 11. A rear hole portion 16*a* that opens to the rear (the Y2 direction) and a front hole portion 16*b* that opens to the front (the Y1 direction) are formed in the second space 16 so as to communicate with each other. The front hole portion 16*b* is formed so that the dimension of its opening is slightly greater than that of the rear hole portion 16*a*.

The second magnetic field emitter 20 is held within the rear hole portion 16*a* of the second space 16. The second magnetic field emitter 20 has an inner yoke 21. The inner yoke 21 may be formed of the same magnetic metal as the main yoke 11. The inner yoke 21 is fitted into the rear hole portion 16*a* of the second space 16 so that there is substantially no gap with an outer circumferential surface 21*a* of the inner yoke 21, and is anchored in this position using an adhesive or the like.

A forward recess 22 that is open toward the front (in the Y1 direction) is formed in the inner yoke 21. The forward recess 22 has an inner circumferential surface 22*a*, which is a cylindrical surface that is centered on the center line O, and an inner base surface 22*b*, which is a plane that is orthogonal to the center line O.

A second magnet 23 that is anchored to the inner base surface 22*b* and an opposing yoke 24 that is anchored to the front of the second magnet 23 are provided within the forward recess 22. The second magnet 23 has a front surface 23*a* to which the opposing yoke 24 is anchored and a rear surface 23*b* that is anchored to the inner base surface 22*b*, and is magnetized in the front-back direction so that the front surface 23*a* and the rear surface 23*b* have different poles.

A second magnetic gap G2 is formed between the outer circumferential surface of the opposing yoke 24 and the inner circumferential surface 22*a* of the forward recess 22. The second magnetic gap G2 has a ring shape. The magnetic flux emitted from the second magnet 23 crosses the second magnetic gap G2. The second magnetic gap G2 has a smaller radius from the center line O than that of the first magnetic gap G1, and the second magnetic gap G2 is located within the space surrounded by the first magnetic gap G1.

A second diaphragm 45 for producing sound pressure in high bands is provided in front of the second magnetic field emitter 20. The second diaphragm 45 may be formed in a dome shape, using a synthetic resin sheet, a cloth sheet, a paper sheet, or a material that is a composite thereof. As shown in FIG. 1 and FIG. 2, a small-diameter bobbin 46 that extends rearward is provided at a skirt area of the second diaphragm 45, and a second voice coil 47 that is wound upon this bobbin 46 is positioned within the second magnetic gap G2.

As shown in FIG. 1 and FIG. 2, a ring-shape support member 49 is anchored within the front hole portion 16*b* in the second space 16 of the main yoke 11, and a forward damper member 48 is provided between the skirt area of the second diaphragm 45 and the support member 49. The forward damper member 48 may be formed of a synthetic resin sheet, a cloth sheet, a paper sheet, or a material that is a composite thereof, and circular depressions and protrusions are formed therein centered on the center line O.

As shown in FIG. 1 and FIG. 2, a horn portion 18 is formed in a front area of the inner peripheral yoke 11*b* of the main yoke 11, and is formed integrally therewith. The front surface of the horn portion 18 corresponds to a horn surface 18*a* whose opening diameter gradually increases toward the front. With this composite speaker 1, it is not necessary to provide the first diaphragm 41, a support mechanism for the first diaphragm 41, or the like around the second diaphragm 45, and thus the horn surface 18*a* can be disposed in front of the first magnet 13, the first voice coil 31, and so on. Furthermore, because the horn surface 18*a* can be formed having a sufficiently wide surface area, sound pressure in high bands produced by the vibration of the second diaphragm 45 can be directed forward in an efficient manner.

A method for assembling the composite speaker 1 structured as shown in FIG. 1 will be described hereinafter.

First, the outer peripheral yoke 11*a* and the inner peripheral yoke 11*b* that configure the main yoke 11 are joined, and the first magnetic field emitter 10 is configured by anchoring the first magnet 13 within the first space 12 formed between the outer peripheral yoke 11*a* and the inner peripheral yoke 11*b*.

As shown in FIG. 3, after the first voice coil 31 and radial linking members 32 have been assembled with the cylindrical linking member 33, the inner peripheral end 41*a* of the first diaphragm 41 is joined to the outer circumferential surface of the cylindrical linking member 33. The inner frame 2 and the outer frame 3 are connected, the cylindrical linking member 33 is supported on the inner frame 2 via the damper member 34, and the outer peripheral end 41*b* of the first diaphragm 41 is supported on the outer frame 3 via the outer damper member 43.

The radial linking members 32 are inserted into the slits 13*c* and the slits 15 of the first magnetic field emitter 10 toward the Y1 direction, and the first voice coil 31 is positioned within the first magnetic gap G1. Then, the outer peripheral yoke 11*a* of the main yoke 11 is anchored to the inner frame 2, and the main yoke 11 and the first diaphragm 41 are connected via the inner damper member 42.

Meanwhile, the second magnetic field emitter 20 is configured by stacking and anchoring the second magnet 23 and the opposing yoke 24 in that order in the Y1 direction within the forward recess 22 formed in the inner yoke 21. The assembled second magnetic field emitter 20 is then inserted and fitted, toward the Y2 direction, into the rear hole portion 16*a* of the second space 16 formed in the inner peripheral yoke 11*b*.

Meanwhile, the second diaphragm 45, to which the bobbin 46 and the second voice coil 47 have been attached, is supported on the support member 49 via the damper member 48. The ring-shaped support member 49 is then mounted, toward the Y2 direction, within the front hole portion 16*b* in the second space 16 of the inner peripheral yoke 11*b*, and the second voice coil 47 is inserted into the second magnetic gap G2.

Note that as shown in FIG. 3, a small-sized speaker unit for higher ranges may be assembled in advance by anchoring the support member 49 to the front end surface of the inner yoke 21 which forms the second magnetic field emitter 20 using an adhesive or the like and inserting the second voice coil 47 into the second magnetic gap G2; this small-sized speaker unit may then be fitted into the second space 16 formed in the inner peripheral yoke 11*b*, toward the Y2 direction.

In the assembly process for the composite speaker 1, the first voice coil 31 that drives the first diaphragm 41 is inserted into the first space 12 of the first magnetic field emitter 10, from the rear and toward the Y1 direction. In addition, the second magnetic field emitter 20 and the support member 49 that supports the second diaphragm 45 are inserted into the second space 16, from the front and toward the Y2 direction. Alternatively, a small-sized speaker unit in which the support member 49 has been anchored to the second magnetic field emitter 20 is inserted into the second space 16, from the front and toward the Y2 direction.

The second magnetic field emitter 20 can be assembled as a single unit, or a speaker unit can be assembled by combining the second magnetic field emitter 20 and the second diaphragm 45, and thus the assembly process becomes easy.

At least part of the second magnetic field emitter 20, which has the inner yoke 21, the second magnet 23, and the opposing yoke 24, is positioned between the front end and the rear end of the ring-shaped first magnet 13, and thus the magnetic field emitter can be made thinner. In particular, with the composite speaker 1 shown in FIG. 1 and FIG. 2, the second magnetic field emitter 20 is positioned within the second space 16 that passes through to the front and rear. As a result, the entirety of the second magnetic field emitter 20 is positioned between the front end and the rear end of the first magnet 13, which makes it possible to realize an even thinner configuration.

As shown in FIG. 1, the bobbin that supports the first voice coil 31, the linking members, and furthermore, an inner end portion 41*a* of the first diaphragm 41 are not positioned in front of the main yoke 11, and thus the shape, size, and so on of the forward damper member 48, support member 49, and so on that support the second diaphragm 45 can freely be set. In addition, the surface area and diameter of the horn surface 18*a* that is formed integrally with the inner peripheral yoke 11*b* can be sufficiently increased, which makes it possible to effectively direct sound pressure in higher bands produced by vibrations of the second diaphragm 45 in the forward direction. Note that the horn portion 18 may be formed entirely as a separate piece from the inner peripheral yoke 11*b*, and may then be anchored to the main yoke 11.

With the composite speaker 1 shown in FIG. 1, the inner peripheral end 41*a* of the first diaphragm 41 is positioned closer to the front of the main yoke 11 than the rear end of the main yoke 11, and the outer peripheral end 41*b* of the first diaphragm 41 is positioned closer to the rear of the main yoke 11 than the front end of the main yoke 11. For this reason, a composite speaker that produces mid ranges or low ranges along with high ranges can be configured with an extremely thin structure.

Figure 4:
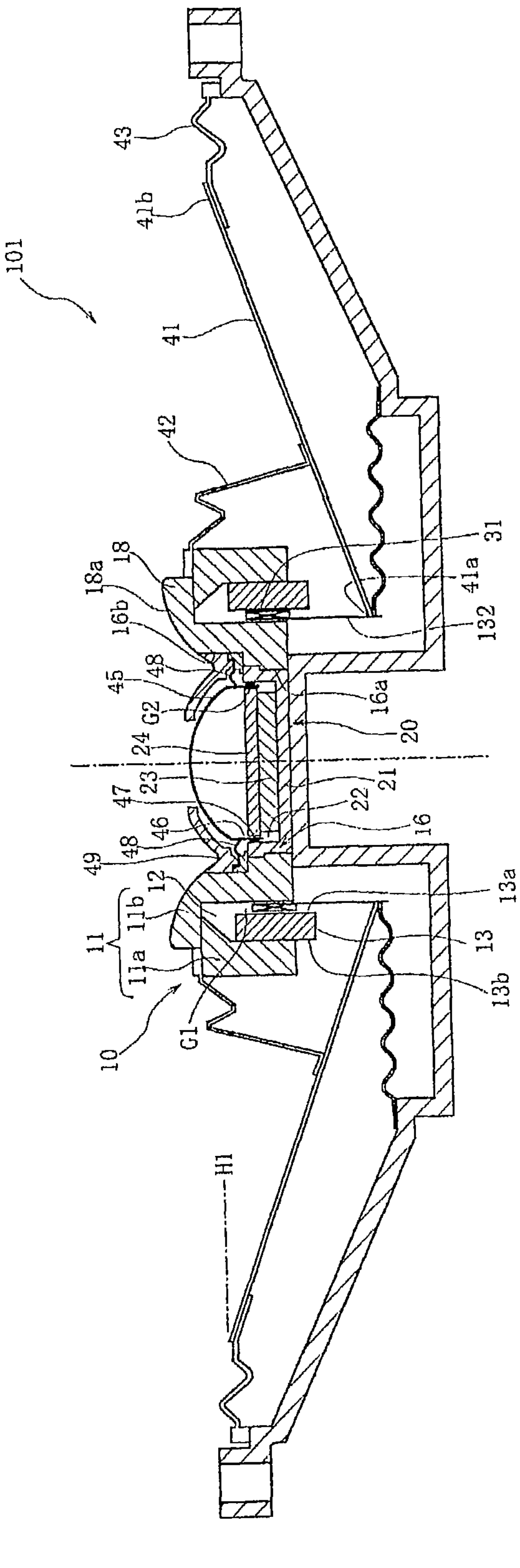
FIG. 4 is a vertical cross-sectional view of a composite speaker according to a second embodiment of the present invention.

A composite speaker 101 according to a second embodiment, shown in FIG. 4, includes the first magnetic field emitter 10 and the second magnetic field emitter 20, which have the same structure as those in the speaker 1 shown in FIG. 1. Furthermore, the second diaphragm 45, the support member 49, the second voice coil 47, and so on are the same as those in the speaker 1 shown in FIG. 1.

In the composite speaker 101 according to the second embodiment, a bobbin 132 is connected to the inner peripheral end 41*a* of the first diaphragm 41. The bobbin 132 extends from the inner peripheral end 41*a* toward the front (that is, in the Y1 direction), and the first voice coil 31 is attached to the front end thereof. The first voice coil 31 and the bobbin 132 are inserted into the first magnetic gap G1 formed in the main yoke 11, toward the Y1 direction.

In this composite speaker 101 as well, the outer peripheral end 41*b* of the conical first diaphragm 41 is positioned closer to the rear than the end of the main yoke 11 on the Y1 side. Accordingly, the front-to-rear dimension can be made thinner.

In both the speakers 1 and 101 according to the embodiments of the invention shown in FIG. 1 and FIG. 4, part of the main yoke 11 is positioned in a region that is both further toward the rear than a horizontal line H1 that passes through the outer peripheral end 41*b* of the conical first diaphragm 41 and further toward the front than the inner peripheral end 41*a* of the first diaphragm 41. In other words, at least part of the main yoke 11 is positioned within a conical inner space surrounded by the first diaphragm 41. Accordingly, it is easier to make the front-to-rear dimensions thinner. Furthermore, if the structure is such that the entirety of the main yoke 11 is positioned further to the rear than the outer peripheral end 41*b* of the first diaphragm 41 and further to the front than the inner peripheral end 41*a*, an even thinner structure can be realized.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. A composite speaker comprising a first diaphragm having a surface area, a second diaphragm having a smaller surface area than the first diaphragm, a first voice coil that drives the first diaphragm, and a second voice coil that drives the second diaphragm, wherein a first space that is open at least toward the rear is formed in a main yoke formed of a magnetic material, a ring-shaped first magnet is anchored to the interior of the first space, a first magnetic gap is formed between the inner circumferential surface or the outer circumferential surface of the first magnet and the main yoke, and the first voice coil is positioned within the first magnetic gap; and a second space that is open at least toward the front is formed in a region surrounded by the first magnet of the main yoke, and the second voice coil and a second magnetic field emitter that drives the second voice coil are housed within the second space.

2. The composite speaker according to claim 1, wherein the first diaphragm is radially positioned further outward than the first voice coil and the second diaphragm is radially positioned further inward than the second voice coil.

3. The composite speaker according to claim 2, wherein the second space is formed so as to pass through the main yoke from front to back.

4. The composite speaker according to claim 3, wherein the second magnetic field emitter is positioned within a region surrounded by the ring-shaped first magnet.

5. The composite speaker according to claim 4, wherein the second magnetic field emitter includes an inner yoke having a forward recess that is open toward the front, a second magnet anchored to the inner base of the forward recess, and an opposing yoke anchored to the front of the second magnet, a second magnetic gap in which the second voice coil is positioned is formed between the inner circumferential surface of the forward recess and the opposing yoke, and the inner yoke is mounted in the second space from the front.

6. The composite speaker according to claim 5, wherein at least part of the main yoke is positioned further toward the rear than an outer peripheral end of the first diaphragm and further toward the front than an inner peripheral end of the first diaphragm.

7. The composite speaker according to claim 6, wherein the inner peripheral end of the first diaphragm is positioned more toward the rear than the front end of the main yoke.

8. The composite speaker according to claim 7, wherein multiple slits that are open toward the rear are provided in the main yoke so as to communicate with the first space, and linking members that connect the first diaphragm to the first voice coil are positioned within the slits.

9. The composite speaker according to claim 8, wherein a horn portion that directs sound pressure produced by the second diaphragm vibrating toward the front is provided in front of the first voice coil.

10. A composite speaker comprising a first diaphragm having a surface area, a second diaphragm having a smaller surface area than the first diaphragm, a first voice coil that drives the first diaphragm, and a second voice coil that drives the second diaphragm, wherein a first space that is open at least toward the rear is formed in a main yoke formed of a magnetic material, a ring-shaped first magnet is anchored to the interior of the first space, a first magnetic gap is formed between the inner circumferential surface or the outer circumferential surface of the first magnet and the main yoke, and the first voice coil is positioned within the first magnetic gap; and a second space that is open at least toward the front is formed in a region surrounded by the first magnet of the main yoke, and the second voice coil and a second magnetic field emitter that drives the second voice coil are housed within the second space, wherein the second space is formed so as to pass through the main yoke from front to back.

11. The composite speaker according to claim 10, wherein the second magnetic field emitter is positioned within a region surrounded by the ring-shaped first magnet.

12. The composite speaker according to claim 11, wherein the second magnetic field emitter includes an inner yoke having a forward recess that is open toward the front, a second magnet anchored to the inner base of the forward recess, and an opposing yoke anchored to the front of the second magnet, a second magnetic gap in which the second voice coil is positioned is formed between the inner circumferential surface of the forward recess and the opposing yoke, and the inner yoke is mounted in the second space from the front.

13. The composite speaker according to claim 12, wherein at least part of the main yoke is positioned further toward the rear than an outer peripheral end of the first diaphragm and further toward the front than an inner peripheral end of the first diaphragm.

14. The composite speaker according to claim 13, wherein the inner peripheral end of the first diaphragm is positioned more toward the rear than the front end of the main yoke.

15. The composite speaker according to claim 14, wherein multiple slits that are open toward the rear are provided in the main yoke so as to communicate with the first space, and linking members that connect the first diaphragm to the first voice coil are positioned within the slits.

16. The composite speaker according to claim 15, wherein a horn portion that directs sound pressure produced by the second diaphragm vibrating toward the front is provided in front of the first voice coil.

17. The composite speaker according to claim 1, wherein the second magnetic field emitter includes an inner yoke having a forward recess that is open toward the front, a second magnet anchored to the inner base of the forward recess, and an opposing yoke anchored to the front of the second magnet, a second magnetic gap in which the second voice coil is positioned is formed between the inner circumferential surface of the forward recess and the opposing yoke, and the inner yoke is mounted in the second space from the front.

18. A composite speaker comprising a first diaphragm having a surface area, a second diaphragm having a smaller surface area than the first diaphragm, a first voice coil that drives the first diaphragm, and a second voice coil that drives the second diaphragm, wherein a first space that is open at least toward the rear is formed in a main yoke formed of a magnetic material, a ring-shaped first magnet is anchored to the interior of the first space, a first magnetic gap is formed between the inner circumferential surface or the outer circumferential surface of the first magnet and the main yoke, and the first voice coil is positioned within the first magnetic gap; and a second space that is open at least toward the front is formed in a region surrounded by the first magnet of the main yoke, and the second voice coil and a second magnetic field emitter that drives the second voice coil are housed within the second space, wherein at least part of the main yoke is positioned further toward the rear than an outer peripheral end of the first diaphragm and further toward the front than an inner peripheral end of the first diaphragm.

19. The composite speaker according to claim 1, wherein the inner peripheral end of the first diaphragm is positioned further toward the rear than the front end of the main yoke.

20. The composite speaker according to claim 1, wherein multiple slits that are open toward the rear are provided in the main yoke so as to communicate with the first space, and linking members that connect the first diaphragm to the first voice coil are positioned within the slits.

* * * * *